(12) United States Patent
Koura et al.

(10) Patent No.: US 8,383,509 B2
(45) Date of Patent: Feb. 26, 2013

(54) MANUFACTURE METHOD FOR SEMICONDUCTOR DEVICE HAVING IMPROVED COPPER DIFFUSION PREVENTIVE FUNCTION OF PLUGS AND WIRINGS MADE OF COPPER OR COPPER ALLOY AND SEMICONDUCTOR DEVICE OF THIS KIND

(75) Inventors: Yumiko Koura, Kawasaki (JP); Hideki Kitada, Kawasaki (JP); Kiyoshi Ozawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/036,522

(22) Filed: Feb. 28, 2011

(65) Prior Publication Data
US 2011/0151662 A1 Jun. 23, 2011

Related U.S. Application Data

(62) Division of application No. 12/562,628, filed on Sep. 18, 2009, now abandoned, which is a division of application No. 11/249,442, filed on Oct. 14, 2005, now Pat. No. 7,611,984.

(30) Foreign Application Priority Data

Jul. 13, 2005 (JP) ................. 2005-204409

(51) Int. Cl.
*H01L 21/4763* (2006.01)
(52) U.S. Cl. ........................ 438/627; 438/626
(58) Field of Classification Search ............. 438/627, 438/637, 653, 626
See application file for complete search history.

(56) References Cited

U.S. PATENT DOCUMENTS

| | | | |
|---|---|---|---|
| 5,130,274 A | 7/1992 | Harper et al. | |
| 5,948,467 A | 9/1999 | Nguyen et al. | |
| 5,969,422 A | 10/1999 | Ting et al. | |
| 6,160,315 A | 12/2000 | Chiang et al. | |
| 6,249,055 B1 | 6/2001 | Dubin | |
| 6,350,688 B1 * | 2/2002 | Liu et al. | 438/687 |
| 6,664,185 B1 | 12/2003 | Wang et al. | |
| 6,727,177 B1 | 4/2004 | Catabay et al. | |

(Continued)

FOREIGN PATENT DOCUMENTS

| | | |
|---|---|---|
| CN | 1155057 A | 7/1997 |
| JP | 7-60852 A | 6/1995 |

(Continued)

OTHER PUBLICATIONS

Chen et al. ("Chen" Chen, Zhe "Investigation of Dielectric/Metal Bilayer Sidewall Diffusion Barrier for Cu/Porous Ultra-Low-k Interconnects" IEEE Trans. on Dev. and Mat. Rel. vol. 5, No. 1, Mar. 2005 pp. 133-141).*

(Continued)

Primary Examiner — N Drew Richards
Assistant Examiner — Grant Withers
(74) Attorney, Agent, or Firm — Westerman, Hattori, Daniels & Adrian, LLP

(57) ABSTRACT

(a) A copper alloy film containing at least two types of metal elements in addition to copper is formed on the surface of an insulator containing oxygen and formed on a semiconductor substrate. (b) A metal film made of pure copper or copper alloy is formed on the copper alloy film. (c) After the step (a) or (b), heat treatment is performed under the condition that a metal oxide film is formed on a surface of the insulator through reaction between the oxygen in the insulator and the metal elements in the copper alloy film.

7 Claims, 14 Drawing Sheets

U.S. PATENT DOCUMENTS

| | | | |
|---|---|---|---|
| 6,967,155 B2 * | 11/2005 | Lin et al. | 438/622 |
| 2002/0115292 A1 | 8/2002 | Andricacos et al. | |
| 2003/0160332 A1 | 8/2003 | Jiang et al. | |
| 2004/0157431 A1 | 8/2004 | Lin et al. | |
| 2006/0113675 A1 | 6/2006 | Chang et al. | |
| 2008/0290517 A1 | 11/2008 | Kageyama | |

FOREIGN PATENT DOCUMENTS

| | | |
|---|---|---|
| JP | 11054458 A | 2/1999 |
| JP | 2004207251 A | 7/2004 |
| KR | 19990042333 A | 6/1999 |
| WO | 02/45142 A2 | 6/2002 |

OTHER PUBLICATIONS

Chinese Office Action, Issued Nov. 30, 2007, issued in corresponding Chinese Patent Application No. 200510118486X.

Partial European Search Report dated Mar. 29, 2006, issued in corresponding European Application No. 05256204.8.

Korean Office Action dated Mar. 14, 2007, issued in corresponding Korean Application No. 10-2005-0096847.

T. Usui "Low Resistive and Highly Reliable Cu Dual-Damascence Interconnect Technology Using Self-Formed MnSixOy Barrier Layer" Proc. of IITC 2005 Jun. 6, 2005 pp. 188-190.

* cited by examiner

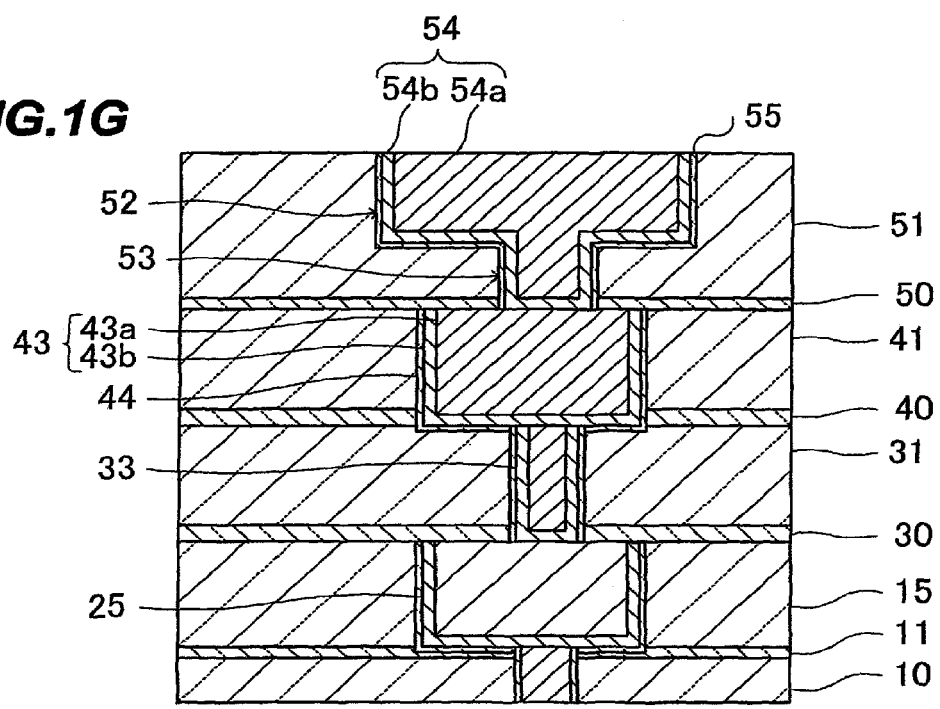

MANUFACTURE METHOD FOR SEMICONDUCTOR DEVICE HAVING IMPROVED COPPER DIFFUSION PREVENTIVE FUNCTION OF PLUGS AND WIRINGS MADE OF COPPER OR COPPER ALLOY AND SEMICONDUCTOR DEVICE OF THIS KIND

CROSS REFERENCE TO RELATED APPLICATION

This application is a division of U.S. application Ser. No. 12/562,628, filed on Sep. 18, 2009, which is a division of U.S. application Ser. No. 11/249,442, filed on Oct. 14, 2005, now U.S. Pat. No. 7,611,984 issued Nov. 3, 2009, which is based on and claims priority of Japanese Patent Application No. 2005-204409 filed on Jul. 13, 2005, the entire contents of which are incorporated herein by reference.

BACKGROUND OF THE INVENTION

A) Field of the Invention

The present invention relates to a semiconductor device manufacture method and a semiconductor device, and more particularly to a manufacture method for a semiconductor device having plugs and wirings made of copper or copper alloy and a semiconductor device of this kind.

B) Description of the Related Art

Copper (Cu) is used as the material of wirings of a semiconductor integrated circuit device. As compared to conventionally used aluminum (Al), copper is likely to diffuse into an insulating film and short circuit occurs easily. Further, a copper film has insufficient adhesion to an insulating film and is likely to be peeled off during a chemical mechanical polishing (CMP) process or the like. Furthermore, copper is likely to be oxidized more than Al. In addition, since a copper oxide film does not suppress diffusion of oxidizing molecules, oxidation advances easily.

In order to prevent copper diffusion and improve tight adhesion to an insulating film, a structure has been adopted in which a barrier metal layer made of Ti, TiN, Ta, TaN, W, WN or the like is inserted between a copper wiring and an insulating film. The material of the barrier metal layer has a higher electric resistivity than copper. As a barrier metal layer is formed on the inner wall of a via hole, particularly a small diameter via hole, a ratio occupied by the barrier metal layer in a plan cross section becomes high and the resistance increases. If a barrier metal layer is made thin to suppress an increase in resistance, it is difficult to maintain a sufficient barrier performance.

Methods of forming a copper wiring which solves the above-described problems are disclosed in Japanese Patent Publication HEI-7-60852 and Japanese Patent Laid-open Publication HEI-11-54458. According to the method disclosed in Publication HEI-7-60852, copper alloy is embedded in a wiring trench formed in an interlayer insulating film. Heat treatment is performed to react an alloy element in the copper alloy with oxygen in the insulating film to form a metal oxide film. This metal oxide film has functions to prevent copper diffusion and improve adhesion. Al or Cr is used as the alloy element.

According to the method disclosed in Laid-open Publication HEI-11-54458, a thin copper alloy layer is formed in a wiring trench and then pure copper is embedded in the wiring trench. Heat treatment is performed to react an alloy element in the copper alloy with oxygen in the insulating film to form a metal oxide film. This metal oxide film has functions to prevent copper diffusion and improve adhesion. Mg, Al, B, Ta, Te, Ti or the like is used as the alloy element.

SUMMARY OF THE INVENTION

The above-described conventional methods have some points to be improved from the viewpoint of forming a film having a sufficient diffusion preventive function with good reproductivity. An object of this invention is to provide a manufacture method for a semiconductor device capable of improving a diffusion preventive function and a semiconductor device of this kind.

According to a first aspect of the present invention, there is provided a manufacture method for a semiconductor device, comprising steps of: (a) forming a copper alloy film containing at least two types of metal elements in addition to copper on a surface of an insulator containing oxygen and formed on a semiconductor substrate; and (b) forming a metal film made of pure copper or copper alloy on the copper alloy film; and further comprising a step of: (c) after the step (a) or (b), performing heat treatment under a condition that a metal oxide film is formed on a surface of the insulator through reaction between the oxygen in the insulator and the metal elements in the copper alloy film.

According to a second aspect of the present invention, there is provided a manufacture method for a semiconductor device comprising steps of: (a) forming a barrier metal layer on a surface of an insulator containing oxygen and formed on a semiconductor substrate, the barrier metal layer being made of refractory metal, alloy containing a refractory metal element, or nitride of a refractory metal element; (b) forming a copper alloy film on the barrier metal layer; and (c) performing heat treatment under a condition that a metal oxide film is formed through reaction between the oxygen in the insulator and a metal element in the copper alloy film in a state that the insulator contacts the copper alloy film.

According to a third aspect of the present invention, there is provided a semiconductor device comprising: an insulating film formed on a semiconductor substrate and made of an insulator containing oxygen; a recess formed in the insulating film; a conductive member embedded in the recess and made of copper or copper alloy; and a metal oxide film disposed at an interface between the insulating film and the conductive member, the metal oxide film containing copper and at least two types of metal elements other than the copper, wherein a partial region of the conductive member contacting the metal oxide film is made of alloy of the copper and at least two types of the metal elements of the metal oxide film.

According to a fourth aspect of the present invention, there is provided a semiconductor device comprising: an insulating film formed on a semiconductor substrate and made of an insulator containing oxygen; a recess formed in the insulating film; a barrier metal layer covering an inner surface of the recess, the barrier metal layer being made of refractory metal, alloy containing a refractory metal element or nitride of a refractory metal element; and a copper alloy film formed on the barrier metal layer, wherein metal oxide is formed in a partial surface region of the insulator through mutual diffusion and reaction between a metal element in the copper alloy film and the oxygen in the insulator film.

According to a fifth aspect of the present invention, there is provided a manufacture method for a semiconductor device comprising steps of: (a) forming a via hole in a via layer insulating film formed on a semiconductor substrate and made of an insulator containing oxygen; (b) forming a first copper alloy film on the via layer insulting film, the first copper alloy film filling the via hole; (c) removing an unnecessary portion of the first copper alloy film and leaving a conductive plug made of copper alloy in the via hole; (d) forming a wiring layer insulating film made of an insulator containing oxygen on the via layer insulating film; (e) forming a wiring trench in the wiring layer insulating film; (f) forming a second copper alloy layer filling the wiring trench in the wiring layer insulating film; and (g) removing an unnecessary portion of the second copper alloy film and leaving a wiring made of copper alloy in the wiring trench; and further comprising steps of: (h) after the step (b), performing a first heat treatment to form a via metal oxide film at an interface between the via layer insulating film and the conductive plug through reaction between a constituent element of the conductive plug and the oxygen in the via layer insulating film; and (i) after the step (f), performing a second heat treatment to form a wiring metal oxide film at an interface between the wiring layer insulating film and the wiring through reaction of a constituent element of the wiring and the oxygen in the wiring layer insulating film.

In the method and device of the first and third aspects, a metal oxide film containing copper and two types of metal elements has a diffusion preventive function. In the method and device of the second and fourth aspects, since metal oxide is formed in the region of the barrier metal layer having an insufficient barrier performance, a sufficient barrier performance can be retained. In the fifth aspect, since the conductive plug and wiring are formed separately by sputtering, CVD, plating and the like, a selection range of material combinations can be broadened.

BRIEF DESCRIPTION OF THE DRAWINGS

FIG. 1G is a cross sectional view of the semiconductor device of the first embodiment.

DESCRIPTION OF THE PREFERRED EMBODIMENTS

Figure 1A:
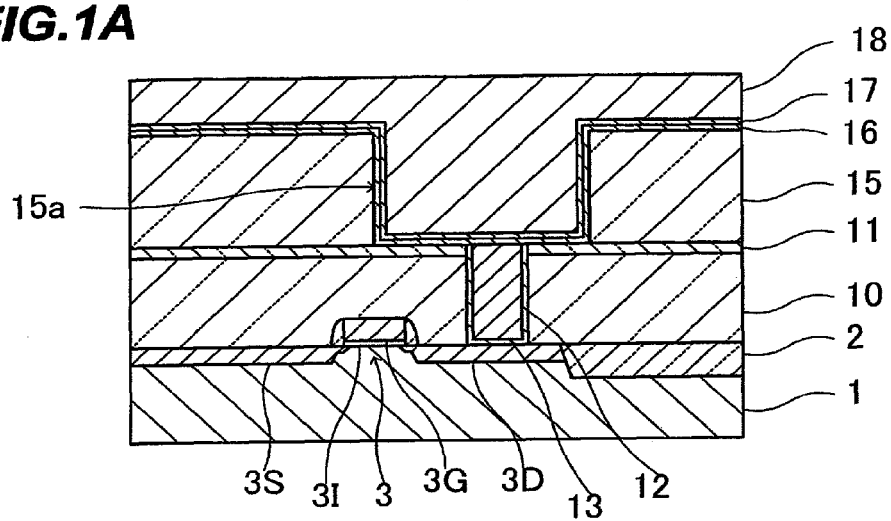
FIGS. 1A to 1F are cross sectional views of a semiconductor device during intermediate manufacture processes illustrating a manufacture method for the semiconductor device according to a first embodiment.

Prior to describing embodiments of the present invention, description will be made first on the studies of a mutual diffusion phenomenon occurred when conductive films of various copper alloys were formed on an insulating film which contains oxygen. The present inventors have studied the characteristics of a metal oxide film which was formed, when a conductive film of copper alloy was formed on an oxygen containing insulating film of silicon oxide or the like, at the interface of the films. It has been found that alloy elements of copper alloy are classified into the following three groups.

The first group includes Al, Mg, Mn and Cr. As a copper alloy containing these metals as an alloy element is formed on a silicon oxide film and heat treatment is performed, a variation in film thicknesses is small and a thin metal oxide film is formed. The thickness of the metal oxide film can be controlled with good reproductivity, by controlling a heat treatment temperature. This metal oxide film has a higher oxygen diffusion preventive function than that of a metal oxide film made of copper alloy containing metals in the other groups as an alloy element. The first group is therefore effective for preventing oxidation of copper. However, the first group provides a copper diffusion preventive function which is insufficient as compared to copper alloy containing metals in the other groups as an alloy element.

The second group includes Ti, Ta and Zr. By using copper alloy containing these metals as an alloy element, a metal oxide film can be formed which has a higher copper diffusion preventive function than by using copper alloy containing metals in the other groups as an alloy element. However, the oxygen diffusion preventive function is inferior to that using copper alloy containing metals in the first group. Such characteristics can be considered common in cases where refractory metals are used as an alloy element. It is difficult to lower the resistance of copper alloy by heat treatment if Ti and Ta are used as an alloy element.

The third group includes Sn, In, Zn, Ni and Co. If copper alloy containing these metals is used, it is not possible to form a metal oxide film having a sufficiently high copper diffusion preventive function. However, a metal oxide film is formed which has a resistivity (about $1\times10^{-4}$ $\Omega\cdot$cm) lower than that of a metal oxide film using copper alloy containing metals in the other groups. CuSn, CuZn, CuNi and CuCo have the characteristics that they can be formed by a plating method. As the plating method is adopted, a film having a uniform thickness can be formed easily on the inner surface of a trench and a via hole having a large aspect ratio.

The copper alloy containing metals of the first to third groups is more excellent in electromigration resistance and stressmigration resistance than pure copper. Copper alloy containing metals in the second group is the most excellent in the stressmigration resistance, and copper alloy containing metals in the first group is more excellent than copper alloy containing metals in the third group.

With reference to FIGS. 1A to 1G, description will be made on a semiconductor manufacture method according to the first embodiment.

As shown in FIG. 1A, an element isolation insulating film 2 of a shallow trench isolation (STI) structure is formed in a surface layer of a semiconductor substrate 1 of silicon to define active regions. A MOS transistor 3 is formed in an active region. The MOS transistor 3 is constituted of a source region 3S, a drain region 3D, a gate insulating film 3I and a gate electrode 3G.

An interlayer insulating film 10 of silicon oxide having a thickness of 300 nm and a protective film 11 of SiOC having a thickness of 50 nm are formed on the semiconductor substrate 1, covering the MOS transistor 3. A via hole is formed through the protective film 11 and interlayer insulating film 10, a partial surface of the drain region 3D being exposed on the bottom of the via hole. A conductive plug 13 of tungsten (W) is embedded in the via hole. A barrier metal layer 12 of TiN having a thickness of 25 nm is formed between the conductive plug 13 and the inner surface of the via hole.

This structure can be formed by well-known photolithography, etching, chemical vapor deposition (CVD), chemical mechanical polishing (CMP) and the like.

An interlayer insulating film 15 of porous silica is formed on the protective film 11. For example, the interlayer insulating film 15 can be formed by a coating method using nano-clustering silica (NCS) which is low dielectric constant material and is available from Catalysts & Chemicals Industries Co. Ltd. In addition to porous silica, organic polymer insulating material may be used, such as SiLK manufactured by the Dow Chemical Company. These materials contain oxygen as a constituent element. A wiring trench 15a is formed in the interlayer insulating film 15. The wiring trench 15a reaches the bottom surface of the interlayer insulating film 15. The upper surface of the conductive plug 13 is exposed on the bottom of the wiring trench 15a.

A first film 16 of copper alloy is formed covering the inner surface of the wiring trench 15a and the upper surface of the interlayer insulating film 15. On the first film 16, a second film 17 is formed which is made of copper alloy different from that of the first film 16. Specific materials and film forming methods for the first film 16 and second film 17 will be later described. A thickness of each of the first film 16 and second film 17 is, for example, 5 nm. A metal film 18 of pure copper (Cu) or copper alloy is formed on the second film 17 by an electrolytic plating method. Organic sulfonic acid is added to plating solution as one of additives. A thickness of the metal film 18 is set to a thickness sufficient for the metal film 18 to completely fill the inside of the wiring trench 15a. Copper alloy of the metal film 18 may be CuZn, CuSn, CuNi, CuCo, CuMn or CuSnZn. As the metal film 18 is made of copper alloy, the stressmigration resistance of the metal film 18 can be improved as compared to the case where the metal film is made of pure copper.

After the metal film 18 is formed, heat treatment is performed for about 30 minutes at 300° C. in a reducing atmosphere at a volume ratio between hydrogen and nitrogen of 5:95.

Figure 1B:
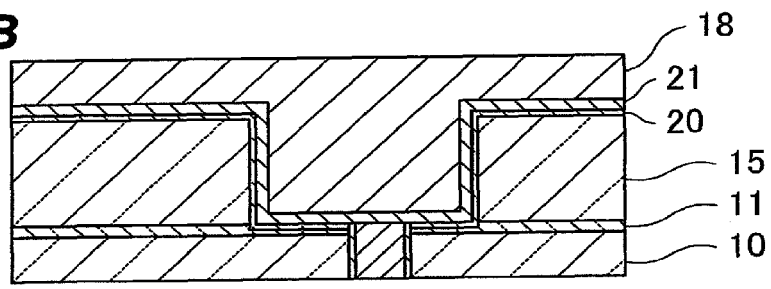

FIG. 1B is a cross sectional view after the heat treatment. In FIG. 1B and subsequent Figures, the substrate 1 and MOS transistor 3 are not shown. Alloy elements in the first film 16 and second film 17 mutually diffuse to form a film 21 which is made of three-element copper alloy containing two alloy elements other than copper. Metal elements in copper alloys react with oxygen elements in the interlayer insulating film 15 and protective film 11 to form a metal oxide film 20 at the interface between the copper alloy film 21 and interlayer insulating film 15 and at the interface between the copper alloy film 21 and protective film 11. A metal oxide film is not formed at the interface between the copper alloy film 21 and conductive plug 13.

Figure 1C:
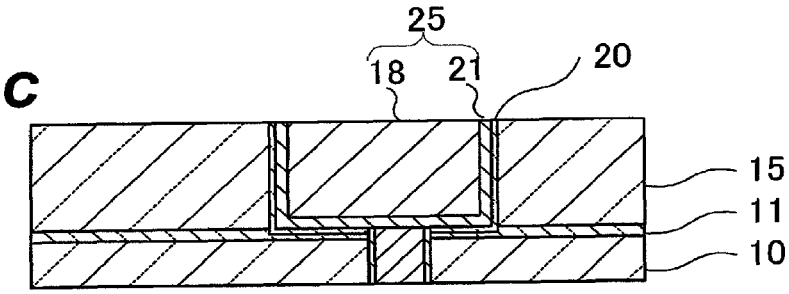

As shown in FIG. 1C, the metal oxide film 20, copper alloy film 21 and metal film 18 deposited at a level higher than the upper surface of the interlayer insulating film 15 are removed by CMP. In this CMP process, as a polishing stopper film, a film of silicon nitride or silicon carbide may be used. A conductive member (wiring) 25 is therefore left in the wiring trench 15a, the conductive member being constituted of the copper alloy film 21 and metal film 18. The metal oxide film 20 is left at the interface between the wiring 25 and interlayer insulating film 15 and at the interface between the wiring 25 and protective film 11.

Figure 1D:
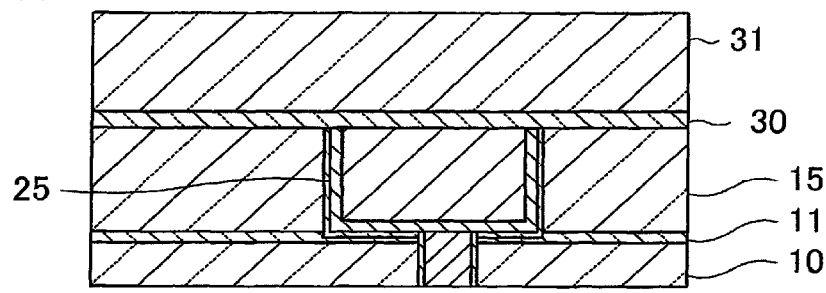

As shown in FIG. 1D, a cap film 30 of SiOC is formed by CVD. A via layer insulating film 31 is formed on the cap film 30. The via layer insulating film 31 is formed by the same material and method as those of the underlying interlayer film 15.

Figure 1E:
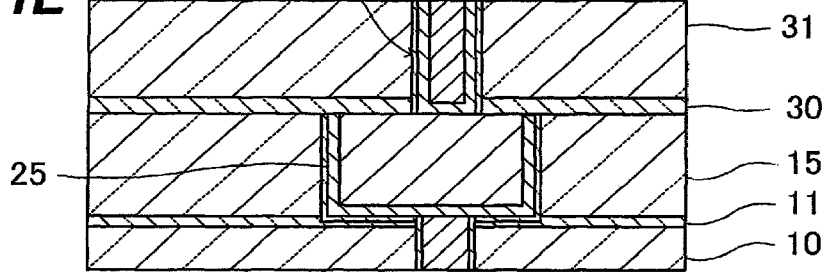

As shown in FIG. 1E, a via hole 32 is formed through the via layer insulating film 31 and cap layer 30. A conductive plug 33 is embedded in the via hole 32. The conductive plug 33 can be formed by the same method as that for the wiring 25 shown in FIGS. 1A to 1C. A via metal oxide film 34 is therefore formed at the interface between the conductive plug 33 and via layer insulating film 31 and at the interface between the conductive plug 33 and cap film 30. The conductive plug 33 is constituted of a copper alloy film 33b covering the inner surface of the via hole 32 and a plug main body 33a filling a remaining space in the via hole 32. The copper alloy film 33b contacts the via metal oxide film 34 and is made of alloy of copper and two types of metal elements constituting the via metal oxide film 34.

The conductive plug 33 is directly connected to the lower wiring without involving the via metal oxide film 34.

Figure 1F:
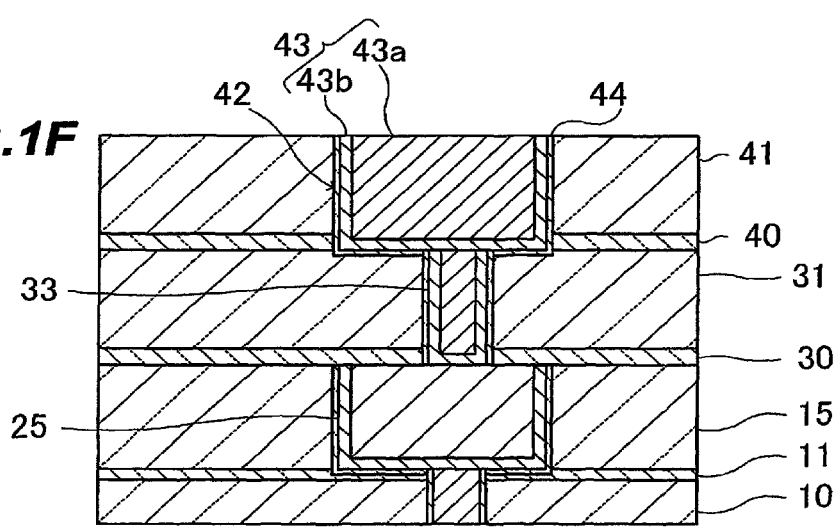

As shown in FIG. 1F, a cap film 40 and a wiring layer insulating film 41 are formed on the via layer insulating film 31. The cap film 40 and wiring layer insulating film 41 are made of the same materials as those of the underlying cap film 30 and via layer insulating film 31, respectively. A wiring trench 42 is formed in the wiring layer insulating film 41 and cap layer 40, exposing the upper surface of the conductive plug 33.

A wiring 43 is embedded in the wiring trench 42 by a method similar to the method of forming the wiring 25 shown in FIGS. 1A to 1C. A wiring metal oxide film 44 is formed at the interface between the wiring 43 and wiring layer insulating film 41, at the interface between the wiring 43 and cap layer 40 and at the interface between the wiring 43 and via layer insulating film 31. The wiring 43 is constituted of a copper alloy film 43b covering the inner surface of the wiring trench 42 and a wiring main body 43a filling a remaining space in the wiring trench 42. The copper alloy film 43b contacts the wiring metal oxide film 44 and contains two types of metal elements constituting the wiring metal oxide film 44 other than copper, as copper alloy elements.

The wiring 43 directly contacts the underlying conductive plug 33 without involving the wiring metal oxide film 44.

As shown in FIG. 1G, a cap film 50 and an interlayer insulating film 51 are formed on the wiring insulating film 41. The cap film 50 and interlayer insulating film 51 are made of the same materials as those of the underlying cap film 40 and wiring layer insulating film 41, respectively. A wiring 54 is formed in a two-layer structure of the cap layer 50 and interlayer insulating film 51 by a well-known dual damascene method. A method of forming the wiring 54 will be described briefly in the following.

First, a wiring trench 52 and a via hole 53 are formed in the two-layer structure of the cap film 50 and interlayer insulating film 51. The wiring trench 52 reaches to an intermediate position of the interlayer insulating film 51 in a depth direction. The via hole 53 exposes a partial upper surface of the underlying wiring 43. A wiring 54 is embedded in the wiring trench 52 and via hole 53 by a method similar to the method of forming the wiring 25 shown in FIGS. 1A to 1C. A metal oxide film 55 is formed at the interface between the wiring 54 and interlayer insulating film 51 and at the interface between the wiring 54 and cap film 50. The wiring 54 is constituted of a copper alloy film 54b covering the inner surfaces of the wiring trench 52 and via hole 53 and a wiring main body 54a filling a remaining space in the wiring trench 52 and via hole 53. The copper alloy film 54b contacts the metal oxide film 55 and contains two types of metal elements constituting the metal oxide film 55 other than copper, as copper alloy elements.

Next, description will be made on the effects of the metal oxide film 20 formed by the process shown in FIG. 1B. The via metal oxide film 34, wiring metal oxide film 44 and metal oxide film 55 shown in FIG. 1G provide the same effects as the effects described below.

In the first embodiment, the first film 16 and second film 17 shown in FIG. 1A are made of different copper alloys from each other. The metal oxide film 20 contains therefore at least two types of metal elements in addition to copper. A diffusion preventive function can be improved more than the case where a metal oxide film contains one type of a metal element. For example, as the alloy element of copper alloy of the first film 16 and second film 17, at least one element can be used selected from a group consisting of Al, Mg, Mn, Cr, Ti, Ta, Zr, Sn, In, Zn, Ni and Co. More improved effects can be obtained by using a preferable combination of alloy elements of copper alloy of the first film 16 and second film 17. Preferred combinations will be described.

Consider first that one of the first film 16 and second film 17 shown in FIG. 1A is made of copper alloy containing a metal selected from a group consisting of Al, Mg, Mn and Cr and the other is made of copper alloy containing a metal selected from a group consisting of Ti, Ta and Zr. Both the first film 16 and second film 17 can be formed by sputtering or chemical vapor deposition. In this case, the metal oxide film 20 contains both the element selected from the group consisting of Al, Mg, Mn and Cr and the element selected from the group consisting of Ti, Ta and Zr. The metal oxide film 20 presents a high barrier performance for oxygen because it contains Al, Mg, Mn or Cr, and a high barrier performance for copper because it contains Ti, Ta or Zr.

If the film containing an element selected from the group consisting of Al, Mg, Mn and Cr is made relatively thick, the barrier performance for oxygen can be improved relatively. Conversely, if the film containing an element selected from the group consisting of Ti, Ta and Zr is made relatively thick, the barrier performance for copper can be improved relatively.

A conventional barrier metal layer is not involved at the interface between the wiring 25 and underlying conductive plug 13, and the wiring and underlying conductive plug contact directly to each other so that an increase in contact resistance can be suppressed.

A conventional barrier metal film using TiN or the like requires a thickness of at least about 10 nm in order to obtain sufficient diffusion preventive effects. In the first embodiment described above, a total thickness of the first film 16 and second film 17 shown in FIG. 1A is about 10 nm, and the metal oxide film 20 is thinner than this thickness. The copper alloy film 21 has a lower resistivity than that of a conventional barrier metal layer. It is therefore possible to suppress an increase in resistance of the wiring and conductive plug. Especially, in the plan cross section of the conductive plug 33 as compared to the wiring, proportion of an area occupied by the barrier metal film to a total area is large. Remarkable effects are expected by using the via metal oxide film 34 in place of a conventional barrier metal film.

Consider next that the first film 16 is made of alloy containing an element selected from a group consisting of Al, Mg, Mn, Cr, Ti, Ta and Zr and the second film 17 is made of copper alloy selected from a group consisting of CuSn, CuZn, CuNi, CuCo and CuSnZn. In this case, the first film 16 can be formed by sputtering or chemical vapor deposition, and the second film 17 can be formed by a plating method. As the plating method is adopted, a film having a uniform thickness can be formed with good productivity even on the inner surface of a recess having a large aspect ratio. Therefore, even if a thickness of the first film 16 is not uniform, it is possible to prevent the diffusion preventive effects and tight adhesion from being lowered by irregular film thickness, by forming the second film 17. In this case, it is preferable to form the second film 17 thicker than the first film 16. For example, a thickness of the first film 16 is set to 4 nm and a thickness of the second film 17 is set to 6 nm.

If a concentration of an alloy element of the first film 16 and second film 17 of copper alloy is made too high, the resistivity becomes high. In order to suppress a rise of the resistivity, it is preferable to set a concentration of an alloy element other than copper to 5.0 atom % or lower. If the concentration of an alloy element is too low, the diffusion preventive function of the metal oxide film lowers. In order to obtain a sufficient diffusion preventive function, it is preferable to set a concentration of an alloy element other than copper to 0.01 atom % or higher.

In the above-described embodiment, the heat treatment process from the state shown in FIG. 1A to the state shown in FIG. 1B is performed for about 30 minutes at about 300° C. in the reducing atmosphere. The reducing atmosphere is not necessarily required because the exposed surface during the heat treatment is removed by CMP in the later process shown in FIG. 1C. For example, the heat treatment may be performed in an inert gas atmosphere or in the atmospheric air. The heat treatment temperature is set to the temperature at which the metal oxide film 20 is formed. If the heat treatment temperature is too low, it takes a long time, whereas if it is too high, already formed semiconductor elements are adversely affected. It is therefore preferable to set the heat treatment temperature to 100° C. or higher and 400° C. or lower. A preferable heat treatment time depends upon the heat treatment temperature. The heat treatment time is set to a time which is necessary and sufficient for forming the metal oxide film 20 having a sufficient barrier performance.

The heat treatment for forming the metal oxide film 20 may be performed after the second film 17 is formed and before the metal film 18 is formed. In this case, the heat treatment atmosphere is preferably a vacuum atmosphere, a reducing atmosphere or an inert gas atmosphere in order to prevent an exposed surface from being oxidized.

Next, with reference to FIGS. 2A to 2C, description will be made on a semiconductor device manufacture method according to the second embodiment.

Figure 2A:
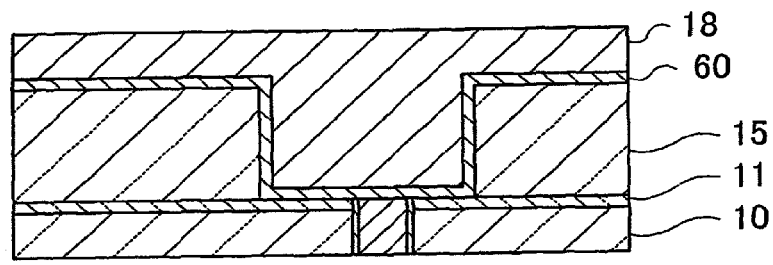
FIGS. 2A to 2C are cross sectional views of a semiconductor device during intermediate manufacture processes illustrating a manufacture method for the semiconductor device according to a second embodiment.

The structure of the protective film 11 and underlying layers shown in FIG. 2A is the same as that of the first embodiment shown in FIG. 1A. In the second embodiment, a single third film 60 is formed instead of the two films, the first film 16 and second film 17 of the first embodiment formed by the process shown in FIG. 1A. The structure of the interlayer insulating film 15 and metal film 18 is the same as that of the first embodiment.

The third film 60 is made of three-element copper alloy containing two types of alloy elements other than copper and can be formed by sputtering or chemical vapor deposition.

The alloy elements are the same as those of copper alloy of the first film 16 and second film 17 of the first embodiment. A thickness of the third film 60 is almost equal to the total thickness of the first film 16 and second film 17 of the first embodiment.

Figure 2B:
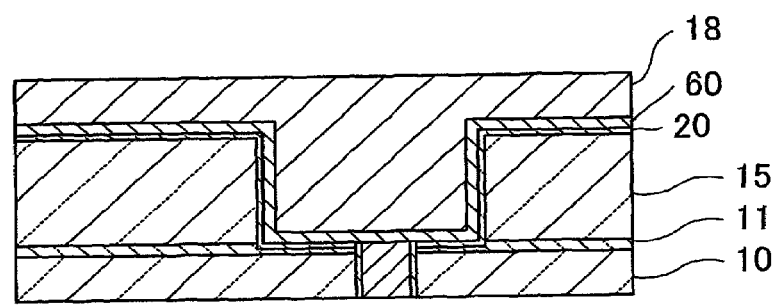

As shown in FIG. 2B, heat treatment is performed to form a metal oxide film 20 at the interface between the interlayer insulating film 15 and third film 60 and at the interface between the protective film 11 and third film 60.

The heat treatment conditions are the same as the heat treatment conditions under which the metal oxide film 20 of the first embodiment shown in FIG. 1B was formed.

Figure 2C:
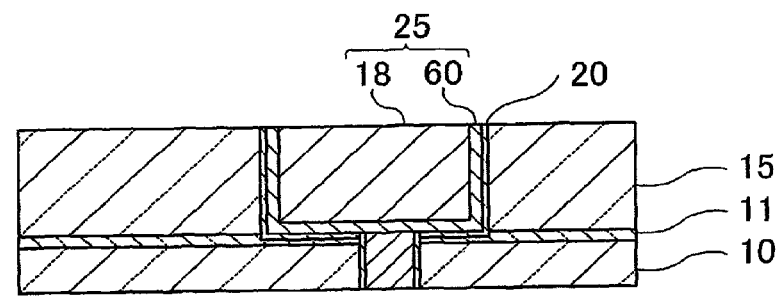

As shown in FIG. 2C, the metal film 18, third film 60 and metal oxide film 20 deposited at a level higher than the upper surface of the interlayer insulating film 15 are removed by CMP.

The third film 30 preferably contains at least two elements selected from a group consisting of Al, Mg, Mn, Cr, Ti, Ta, Zr, Sn, In, Zn, Ni and Co, as alloy elements in addition to copper. In the second embodiment, the third film 60 contains alloy elements contained in the first film 16 and second film 17 of the first embodiment shown in FIG. 1A so that the metal oxide film 20 has the same compositions as those of the metal oxide film 20 of the first embodiment shown in FIG. 1C. The same effects as those of the first embodiment can therefore be obtained.

Sufficient diffusion preventive effects for both copper and oxygen can be obtained if the alloy elements contain at least one metal selected from a group consisting of Al, Mg, Mn and Cr and at least one metal selected from a group consisting of Ti, Ta and Zr.

A concentration of an alloy element of the third film 60 is preferably 0.01 to 5.0 atom % like the first film 16 and second film 17 of the first embodiment. If a concentration of a metal in the group consisting of Al, Mg, Mn and Cr is increased relatively, the oxygen diffusion preventive function can be enhanced relatively. Conversely, if a concentration of a metal in the group consisting of Ti, Ta and Zr is increased relatively, the copper diffusion preventive function can be enhanced relatively.

Next, a modification of the second embodiment will be described. In the second embodiment, the third film 60 shown in FIG. 2A is made of three-element copper alloy. In the modification, it is made of two-element copper alloy. Further, although the metal film 18 of the second embodiment is made of pure copper or copper alloy, the metal film of the modification is made of copper alloy of a type different from the copper alloy of the third film 60. A thickness of the third film 60 is set to about 5 nm.

After the metal film 18 is deposited, heat treatment is performed. With this heat treatment, metal elements constituting the third film 60 and metal elements constituting the metal film 18 react with oxygen contained in the interlayer insulating film 15 and protective film 11 to form a metal oxide film 20. Thereafter, CMP is performed to leave wiring only in the wiring trench like the second embodiment.

With the manufacture method of the modification, the metal film 18 shown in FIG. 2C is made of copper alloy. Although the third film 60 is made of two-element copper alloy immediately after it is formed, it is made of three-element copper alloy by subsequent heat treatment with diffusion of alloy elements in the metal film 18. The metal oxide film 20 contains copper and alloy elements other than copper constituting the metal film 18, and other metal elements, i.e., alloy elements other than copper constituting the third film 60 immediately after it is formed.

Alloy elements other than copper of the third film 60 and metal film 18 can be selected from the group consisting of Al, Mg, Mn, Cr, Ti, Ta, Zr, Sn, In, Zn, Ni and Co. If one of the first film 60 and metal film 18 contains at least one metal selected from a group consisting of Al, Mg, Mn and Cr and the other contains at least one metal selected from a group consisting of Ti, Ta and Zr, sufficient diffusion preventing effects can be obtained for both copper and oxygen.

Next, with reference to FIGS. 3A to 3D, description will be made on a semiconductor device manufacture method according to the third embodiment.

Figure 3A:
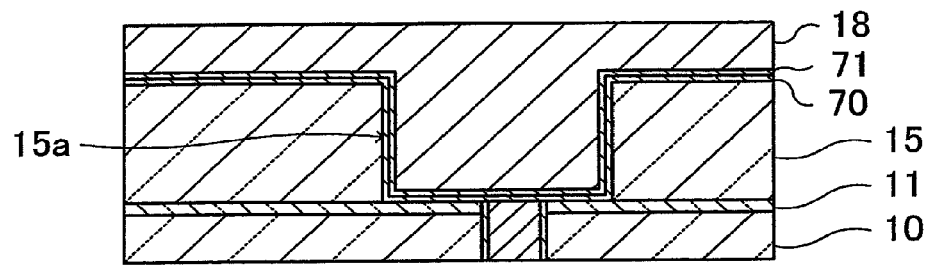
FIGS. 3A to 3C are cross sectional views of a semiconductor device during intermediate manufacture processes illustrating a manufacture method for the semiconductor device according to a third embodiment.

The structure of the protective film 11 and underlying layers shown in FIG. 3A is the same as that of the first embodiment shown in FIG. 1A. On the protective film 11, an interlayer insulating film 15 is formed and a wiring trench 15a is formed in the interlayer insulating film 15. The interlayer insulating film 15 is made of the same material as that of the interlayer insulating film 15 of the first embodiment shown in FIG. 1A. A barrier metal layer 70 is formed covering the inner surface of the wiring trench 15a and the upper surface of the interlayer insulating film 15, the barrier metal layer being made of refractory metal, alloy containing refractory metal or nitride of refractory metal. Refractory metal may be Ta, Ti, W or the like. The barrier metal layer 70 can be deposited, for example, by sputtering or chemical vapor deposition.

A fourth film 71 of copper alloy is formed on the barrier metal layer 70, for example, by sputtering or chemical vapor deposition. The fourth film 71 preferably contains as an alloy element at least one element selected from a group consisting of Al, Mg, Mn, Cr, Ti, Ta, Zr, Sn, In, Zn, Ni and Co. The fourth film may be made of three-element copper alloy containing at least two types of alloy elements other than copper like the third film 60 of the second embodiment shown in FIG. 2A. On the fourth film 71, a metal film 18 is formed. The metal film 18 is made of copper alloy or pure copper capable of being plated like the metal film 18 of the first embodiment shown in FIG. 1A. After the metal film 18 is formed, heat treatment is performed.

Figure 3B:
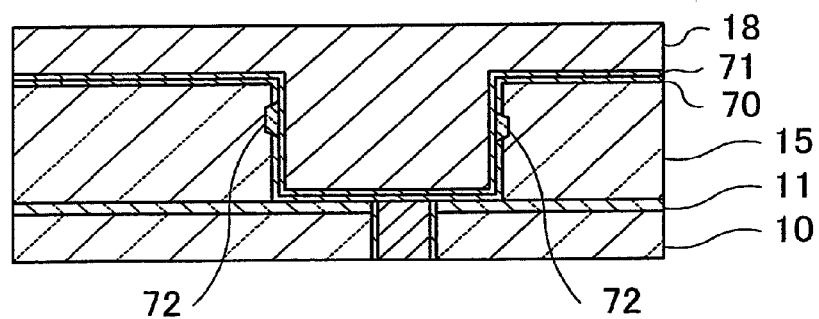

FIG. 3B is a cross sectional view after the heat treatment. It is preferable that the barrier metal layer 70 having a resistivity higher than that of copper alloy is as thin as possible in order to lower electric resistance. As the barrier metal layer 70 is made thin, a region having an insufficient diffusion preventive function may be formed because of an irregular film thickness. In the region having an insufficient diffusion preventive function, copper and an alloy element in the fourth film 71 and oxygen in the interlayer insulating film 15 mutually diffuse to form a metal oxide region 72. The metal oxide region 72 has a function of preventing diffusion of copper and oxygen.

Figure 3C:
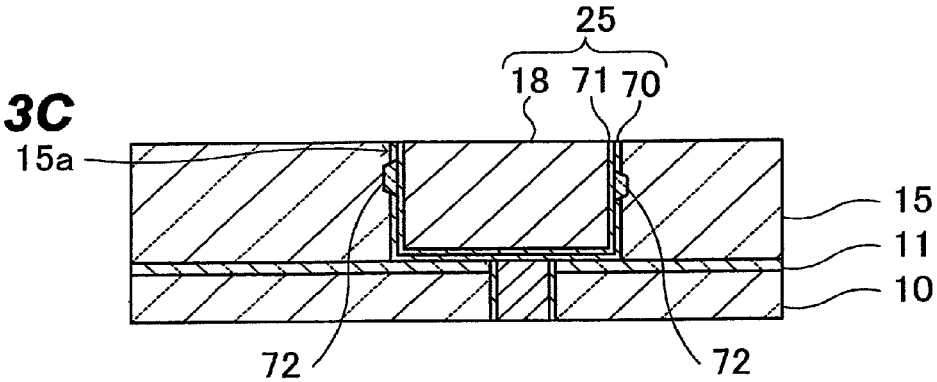

As shown in FIG. 3C, the barrier metal layer 70, fourth film 71 and metal film 18 deposited at a level higher than the upper surface of the interlayer insulating film 15 are removed by CMP. The barrier metal layer 70, fourth film 71 and metal film 18 left in the wiring trench 15a constitute a wiring 25.

Figure 3D:
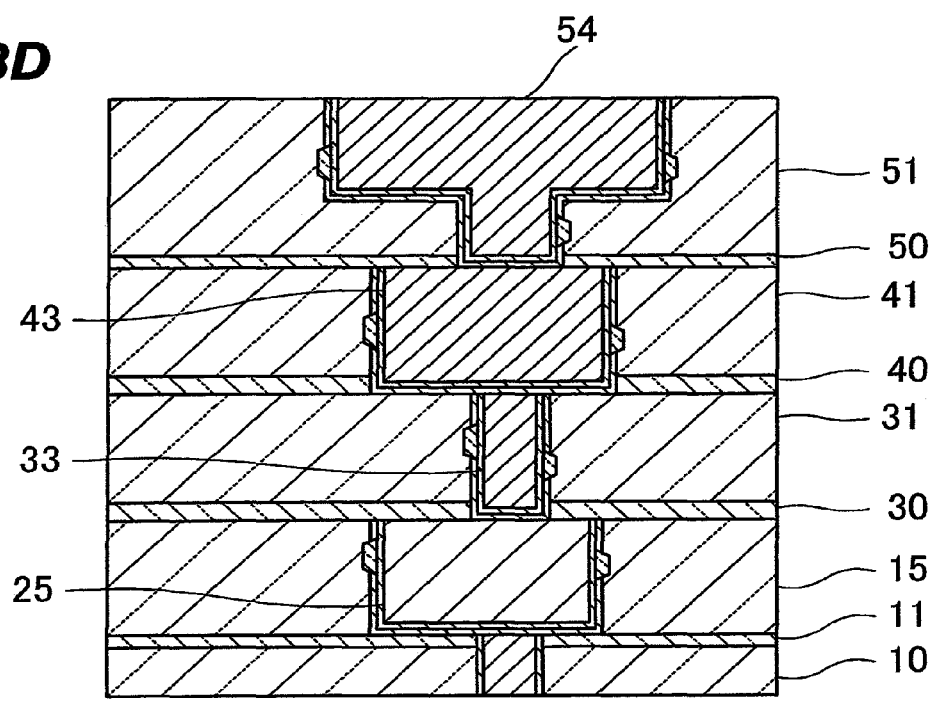
FIG. 3D is a cross sectional view of the semiconductor device of the third embodiment.

As shown in FIG. 3D, a conductive plug 33, a wiring 43 and a wiring 54 by a dual damascene method are sequentially formed on the interlayer insulating film 15 and wiring 25. The structures of and manufacture methods for a cap film 30, a via layer insulating film 31, a cap film 40, a wiring layer insulating film 41, a cap film 50, an interlayer insulating film 51, and via holes and wiring trenches in these insulating films are the same as those of the first embodiment shown in FIG. 1G. The manufacture methods for the conductive plug 33 and wirings 43 and 54 are the same as that for the underlying wiring 25. In each wiring layer, the metal oxide region is formed in an area where the barrier metal layer is thin and the diffusion preventive function is insufficient.

In the third embodiment, even if the region with an insufficient diffusion preventive function is formed in the barrier metal layer 70, a sufficient diffusion preventive function can be retained because the metal oxide region 72 is formed in a self-alignment manner. If the fourth film is not disposed, a thickness of the barrier metal layer 70 is required to be at least about 10 nm to obtain a sufficient diffusion preventive function. In contrast, in the third embodiment, the barrier metal layer can be made thinner. For example, even if a thickness of the barrier metal layer 70 is set to 5 nm or thinner, a sufficient diffusion preventive function can be retained. As the barrier metal layer is thinned, the electric resistance of the conductive plug and wiring can be lowered.

A concentration of an alloy element in the fourth film 71 is preferably set to 0.01 to 5 atom % like the first film 16 and second film 17 of the first embodiment shown in FIG. 1A.

Next, with reference to FIGS. 4A to 4D, description will be made on a semiconductor device manufacture method according to the fourth embodiment. In the fourth embodiment, the process of forming the fourth film 71 of the third embodiment shown in FIG. 3A is omitted.

Figure 4A:
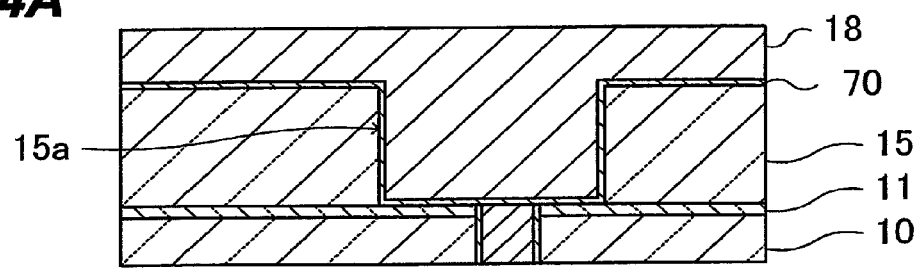
FIGS. 4A to 4C are cross sectional views of a semiconductor device during intermediate manufacture processes illustrating a manufacture method for the semiconductor device according to a fourth embodiment.

As shown in FIG. 4A, a metal film 18 is formed directly on the barrier metal layer 70. The metal film 18 is made of copper alloy capable of being formed by sputtering or plating, such as CuSn, CuZn, CuNi, CuCo, CuMn and CuSnZn. After the metal film 18 is formed, heat treatment is performed. The heat treatment conditions are the same as those under which the metal oxide film 20 of the first embodiment was formed by the process shown in FIG. 1B.

Figure 4B:
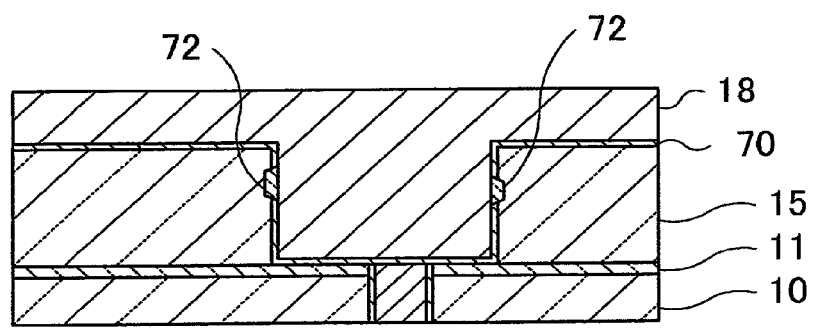

As shown in FIG. 4B, a metal oxide film region 72 is formed in a self-alignment manner in an area where the barrier metal layer 70 has an insufficient diffusion preventive function. In the third embodiment, the alloy element in the fourth film 71 shown in FIG. 3B reacts with oxygen in the interlayer insulating film 15 to form the metal oxide region 72. In the fourth embodiment, an alloy element in the metal film 18 reacts with oxygen in the interlayer insulating film 15. Therefore, in the fourth embodiment, the metal film 18 is made of not pure copper but copper alloy.

Figure 4C:
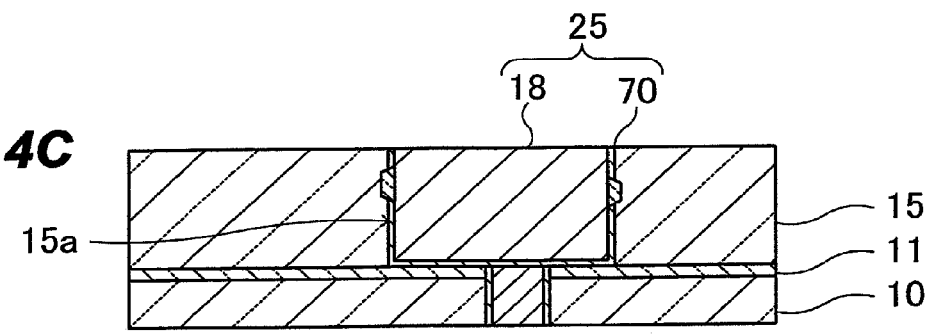

As shown in FIG. 4C, the barrier metal layer 70 and metal film 18 deposited at a level higher than the upper surface of the interlayer insulating film 15 are removed by CMP. A wiring 25 made of the metal film 18 and barrier metal layer 70 is therefore formed in the wiring trench 15a.

Figure 4D:
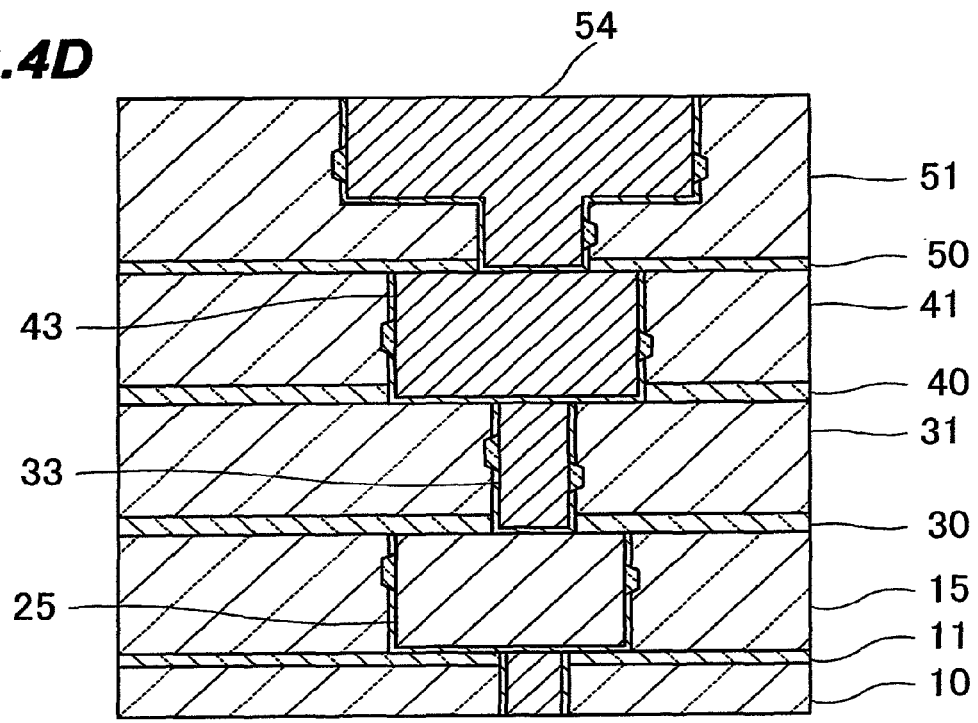
FIG. 4D is a cross sectional view of the semiconductor device of the fourth embodiment.

As shown in FIG. 4D, a conductive plug 33, a wiring 43 and a wiring 54 by a dual damascene method are sequentially formed on the interlayer insulating film 15 and wiring 25. The structures of and manufacture methods for a cap film 30, a via layer insulating film 31, a cap film 40, a wiring layer insulating film 41, a cap film 50, an interlayer insulating film 51, and via holes and wiring trenches in these insulating films are the same as those of the first embodiment shown in FIG. 1G. The manufacture methods for the conductive plug 33 and wirings 43 and 54 are the same as that for the underlying wiring 25. In each wiring layer, the metal oxide region is formed in an area where the barrier metal layer is thin and the diffusion preventive function is insufficient.

Also in the fourth embodiment, since the barrier metal layer can be made thin, an electric resistance of the conductive plug and wiring can be lowered.

In the fourth embodiment, since it is not necessary to form the fourth film 71 of the third embodiment shown in FIG. 3A, the number of film forming processes can be reduced by one. However, in the fourth embodiment, there is a restriction that the metal film 18 cannot be formed by pure copper. The structure of the third embodiment is adopted for the wiring layer V if it is important to lower its resistivity, to form the wiring layer made of pure copper. If a wiring resistivity is not important, e.g., if the wiring may be made thick, adopting the structure of the fourth embodiment is advantageous from the viewpoint of reducing the number of processes.

Figure 5A:
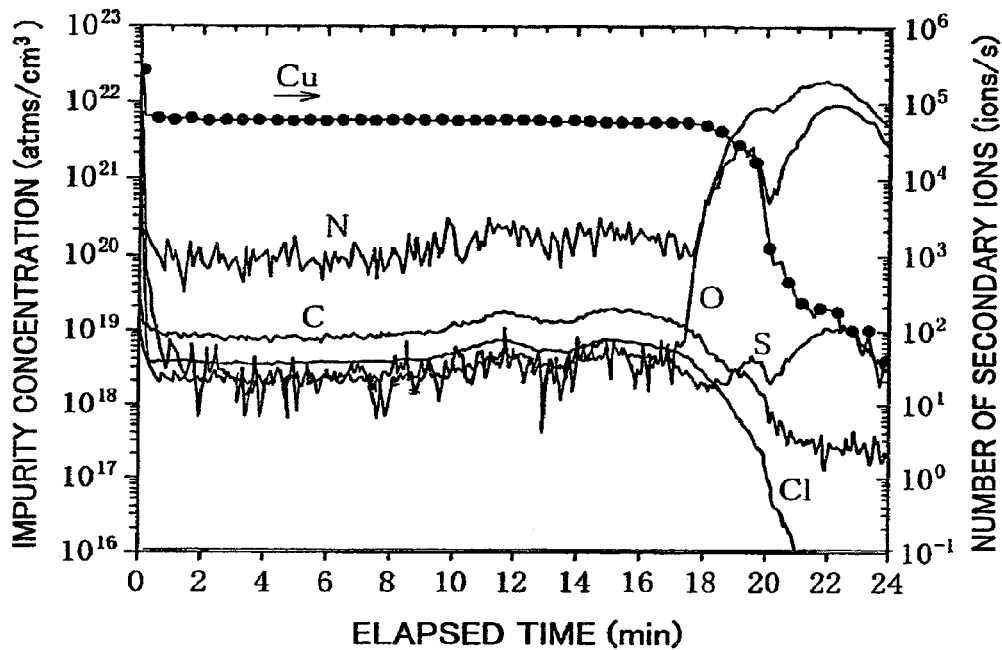
FIG. 5A is a graph showing SIMS analysis results of a Cu film formed by using wiring plating solution.
Figure 5B:
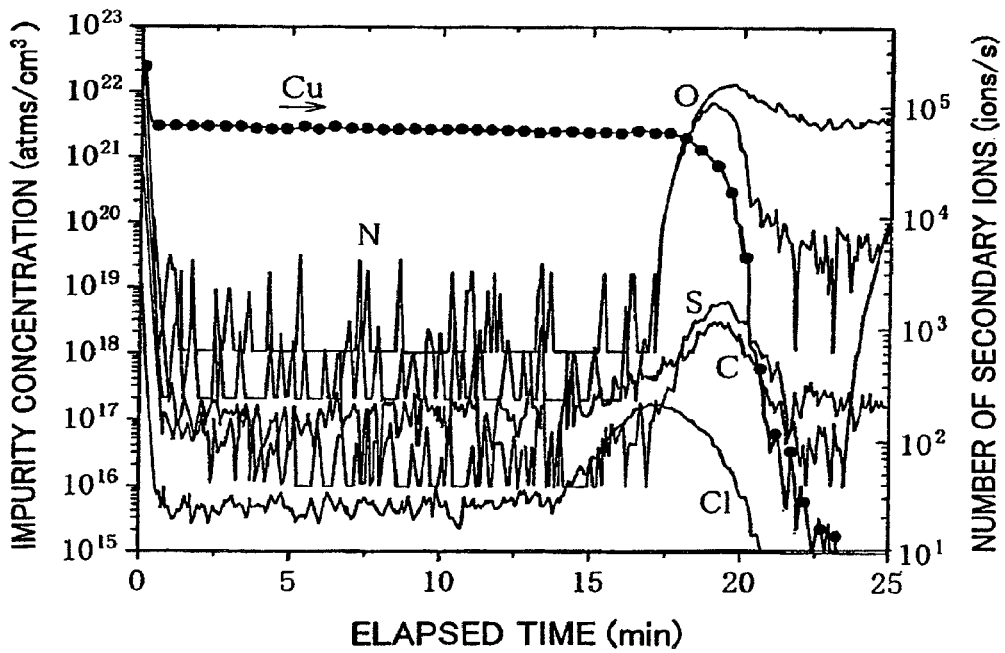
FIG. 5B is a graph showing SIMS analysis results of a Cu film formed by using via plating solution.
Figure 6:
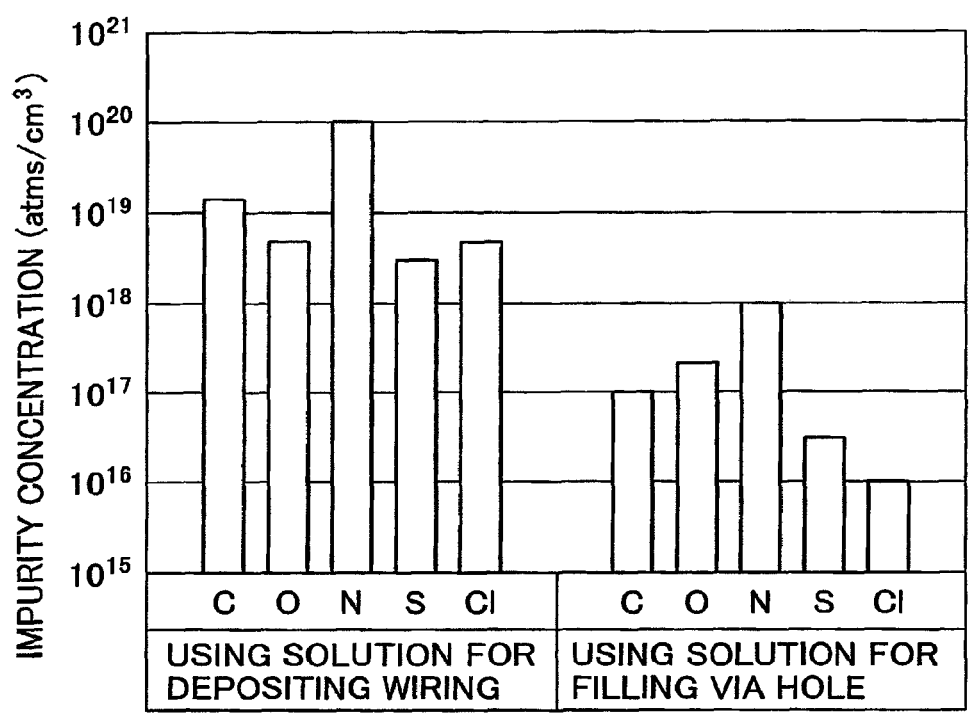
FIG. 6 is a graph showing impurity concentrations in a Cu film formed by using wiring plating solution and via plating solution.
Figure 7:
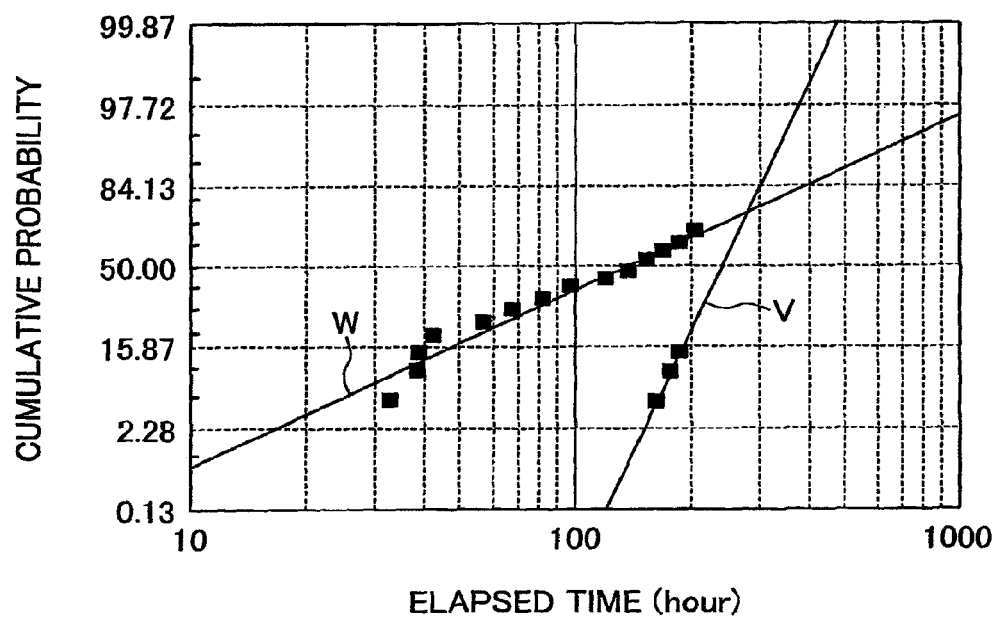
FIG. 7 is a graph showing reliability evaluation results of current paths of evaluation samples.

With reference to FIGS. 5 to 7, description will be made on preferred conditions of forming a conductive plug and wiring by plating methods.

As plating solution for forming the conductive plug which is embedded in the via hole 32 of the first embodiment shown in FIG. 1E, for example, plating solution manufactured by Rohm & Hass Company of USA (former Shipley Company L. L. C.) is used. This plating solution contains 5 to 10 ml/l of accelerator for increasing a film forming speed, 1 to 5 ml/l of suppressor for decreasing the film forming speed, and 1 to 3 ml/l of leveler for smoothing a film surface. As plating solution for forming the wiring which is embedded in the wiring trench 42 shown in FIG. 1F, for example, plating solution manufactured by Enthone Inc is used. This plating solution contains 5 to 10 ml/l of accelerator, 1 to 5 ml/l of suppressor and 1 to 3 ml/l of leveler.

Accelerator is mainly sulfur compound and contributes nuclei formation on a growth surface. Leveler is amine compound and contains nitrogen, carbon, chlorine and the like. Since leveler has dipoles, it moves to an area upon which an electric field is concentrated, and weakens the electric field in this area.

FIGS. 5A and 5B are graphs showing the measurement results, by secondary ion mass spectroscopy (SIMS), of impurity concentrations of Cu films for a conductive plug and a wiring formed by the above-described plating solutions. The abscissa represents an elapsed time from the analysis start in the unit of "minute" and the left ordinate represents an impurity concentration in the unit of "atoms/cm$^3$". The right ordinate represents the number of detected secondary ions in the unit of "ions/s". The abscissa corresponds to the position of the Cu film in the depth direction. Polygonal lines indicated by symbols Cu, N, C, O, S and Cl represent the impurity concentrations of copper, nitrogen, carbon, oxygen, sulfur and chlorine, respectively.

FIG. 6 shows the concentrations of impurity elements averaged in the depth direction of the Cu film. Five left bar graphs represent the impurity concentrations of the Cu film for the conductive plug. It can be seen that the impurity concentrations of the Cu film for a wiring are higher than the impurity concentrations of the Cu film for a conductive plug. The total impurity concentration of carbon, oxygen, nitrogen, sulfur and chlorine of the wiring Cu film is about $1 \times 10^{20}$ atoms/cm$^3$, whereas the total impurity concentration of the conductive plug Cu film is about $1 \times 10^{18}$ atoms/cm$^3$. There is a difference between the impurity concentrations by about two digits. This can be considered that the total impurity atom concentration in the plating solution for forming the conductive plug is lower than the total impurity atom concentration in the plating solution for forming the wiring.

FIG. 7 shows the results of reliability evaluation tests of evaluation samples each having a plurality of conductive plugs and wirings connected in series. The abscissa represents an elapsed time in the unit of "hour" from when a predetermined current is flowed through each evaluation sample, and the ordinate represents a cumulative probability of failure occurrence. Two groups of samples were prepared: a group W of evaluation samples whose conductive plugs and wires were formed by using wiring plating solution; and a group of V of evaluation samples whose conductive plugs were formed by using via plating solution and whose wirings were formed by using wiring plating solution. Namely, the impurity concentration of the conductive plug of the group V samples is lower than that of the wiring. Twenty samples were evaluated for each of the groups W and V. In FIG. 7, straight lines W and V indicate the measurement results of the evaluation samples of the groups W and V, respectively.

After power feeding of 300 hours, electrical continuity failures occurred in fourteen samples of the group W, and in three samples of the group V. These electrical continuity failures are caused by electromigration. The maximum allowable current density of samples of the group W at a temperature of 110° C. was about $1.6 \times 10^5$ A/cm$^2$ and that of samples of the group V was about $1.5 \times 10^6$ A/cm$^2$.

As seen from the evaluation results, the electromigration resistance and maximum allowable current density can be improved by setting the impurity concentration of Cu of the conductive plug lower than the impurity concentration of Cu of the wiring. Improvement on the electromigration resistance may be ascribed to that voids are hard to be formed in the conductive plug because the impurity concentration of the conductive plug is set lower.

It can be considered that if Cu of the wiring is made as highly pure as the conductive plug, the electromigration resistance of the same degree as that of the group V can be obtained. However, it has been found that if the wiring is made highly pure, the stressmigration resistance of the wiring is degraded. This may be ascribed to that voids in the wiring are likely to be diffused after being subjected to a heat history, because of a high purity.

In the embodiment described above, the impurity concentration of Cu of the conductive plug is set relatively low, whereas the impurity concentration of Cu of the wiring is set relatively high. Since the volume of the conductive plug is smaller than that of the wiring, the conductive plug is less influenced by degradation of the stressmigration resistance. Therefore, as shown in FIG. 7, a sufficient stressmigration resistance is ensured while the high electromigration resistance is retained.

A wiring has a larger volume than that of the conductive plug and has a broader contact area with the interlayer insulating film than that of the conductive plug. It can therefore be considered that the stressmigration is likely to occur in the wiring. In order to improve the stressmigration resistance of the wiring, it is preferable to increase the impurity concentration of the wiring more than the conductive plug. The stressmigration resistance and electromigration resistance can be improved by using CuSn alloy or CuSnZn alloy rather than by using pure copper.

In order to obtain the sufficient effects of lowering the impurity concentration of the conductive plug, it is preferable that the total impurity atom concentration of carbon, oxygen, nitrogen, sulfur and chlorine of the conductive plug is one tenth or smaller than the total impurity atom concentration of the wiring. It is preferable that the total impurity atom concentration of the conductive plug is lower than $1 \times 10^{19}$ cm$^{-3}$ and the total impurity atom concentration of the wiring is higher than $1 \times 10^{19}$ cm$^{-3}$.

The evaluations were conducted for the wiring and conductive plug of pure copper. Also in the case where the wiring and conductive plug are made of copper alloy containing copper as a main component, the same effects are expected.

In the above embodiment, the impurity atom concentration of the plating solution for forming the conductive plug is set lower than that of the plating solution for forming the wiring, to thereby set the impurity concentration of the conductive plug lower than that of the wiring. It can be considered that the impurity concentration of plated copper can be adjusted by changing the amplitude of a current flowing in the same plating solution.

Next, with reference to FIGS. 8A to 8F, description will be made on a semiconductor device manufacture method according to the fifth embodiment.

Figure 8A:
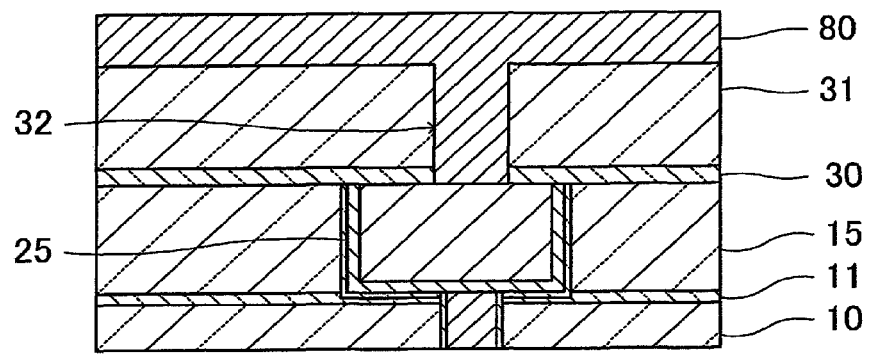
FIGS. 8A to 8F are cross sectional views of a semiconductor device during intermediate manufacture processes illustrating a manufacture method for the semiconductor device according to a fifth embodiment.

The structure of the layer having an interlayer insulating film 15 and a wiring 25 and underlying layers shown in FIG. 8A is the same as that of the semiconductor device of the first embodiment shown in FIG. 1C in an intermediate manufacture process. A cap film 30 and a via layer insulating film 31 are deposited on the interlayer insulating film 15 by the same method as that of the first embodiment shown in FIG. 1D. A via hole 32 is formed through the cap film and via layer insulating film. A partial upper surface of the wiring 25 is exposed on the bottom of the via hole 32.

A copper alloy film 80 is deposited on the via layer insulating film 31. The copper alloy film 80 is deposited to the thickness enough to completely fill the via hole 32. The copper alloy film 80 is made of one copper alloy selected from a group consisting of CuAl, CuMg, CuMn, CuCr, CuTi, CuTa, CuZr, CuSn, CuIn, CuZn, CuNi and CuCo, and formed by sputtering using a copper alloy target.

Figure 8B:
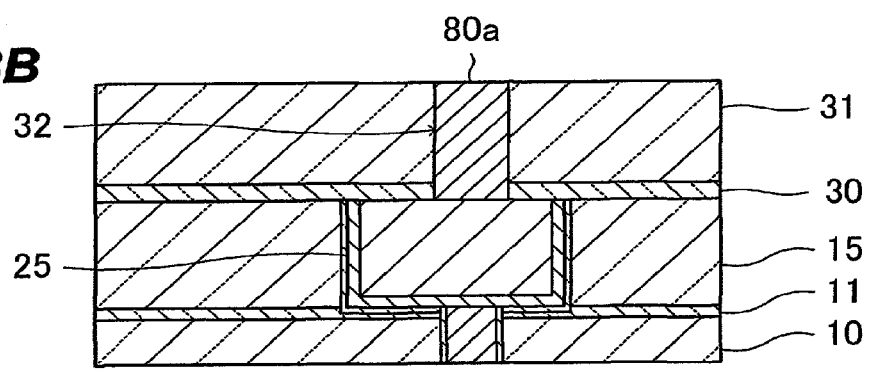

As shown in FIG. 8B, the copper alloy film 80 deposited at a level higher than the upper surface of the via layer insulating film 31 is removed by CMP. A conductive plug 80a of copper alloy is left in the via hole 32.

Figure 8C:
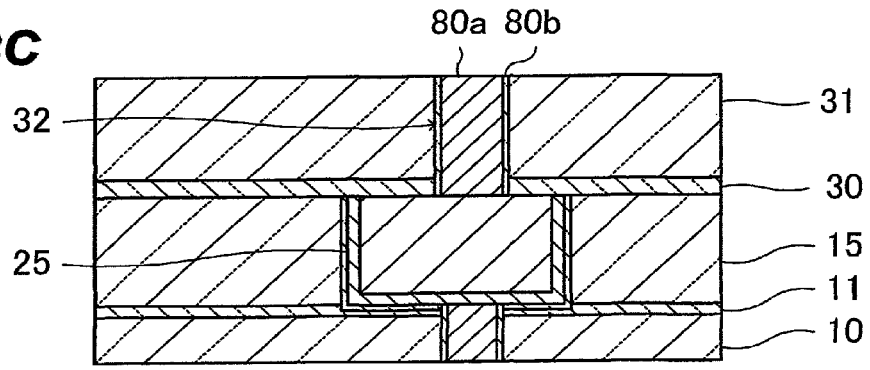

As shown in FIG. 8C, heat treatment is performed at 400° C. in a reducing atmosphere to form a via metal oxide film 80b at the interface between the conductive plug 80a and via layer insulating film 31 and at the interface between the conductive plug 80a and cap film 30. The via metal oxide film 80b is formed while the alloy element in the conductive plug 80a reacts with oxygen in the via layer insulating film 31 and cap film 30.

Figure 8D:
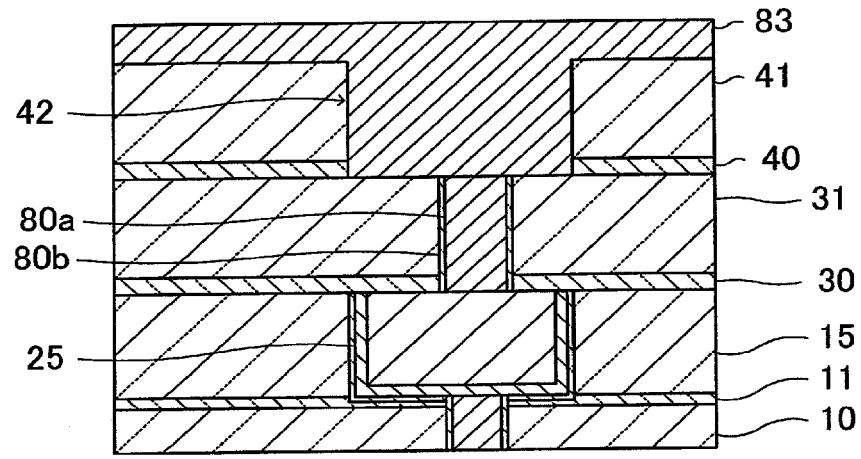

As shown in FIG. 8D, a cap film 40 and a wiring layer insulating film 41 are deposited on the via layer insulating film 31. These two layers are formed by the same method as that for the cap film 40 and wiring layer insulating film 41 of the first embodiment shown in FIG. 1F. A wiring trench 42 is formed reaching the upper surface of the via layer insulating film 31. The upper surface of the conductive plug 80a is exposed on the bottom of the wiring trench 42. A copper alloy film 83 is deposited on the wiring interlayer insulating film 41. The copper alloy film 83 is deposited to a thickness enough to completely fill the wiring trench 42. The copper alloy wiring 83 is made of one copper alloy selected from a group consisting of CuAl, CuMg, CuMn, CuCr, CuTi, CuTa, CuZr, CuSn, CuIn, CuZn, CuNi and CuCo, and contains at least one impurity element selected from a group consisting of C, S, N, O and Cl. This alloy film can be formed by sputtering using a copper alloy target containing impurities.

Figure 8E:
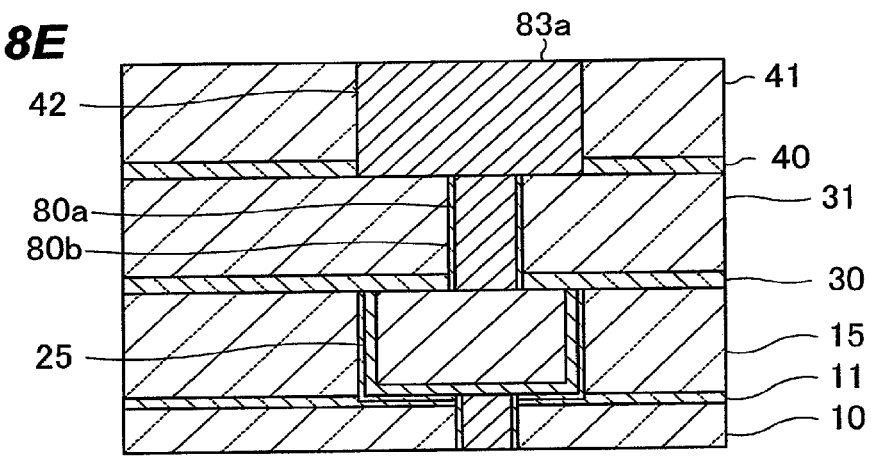

As shown in FIG. 8E, the copper alloy film 83 deposited at a level higher than the upper surface of the wiring layer insulating film 41 is removed by CMP. A wiring 83a of copper alloy is left in the wiring trench 42.

Figure 8F:
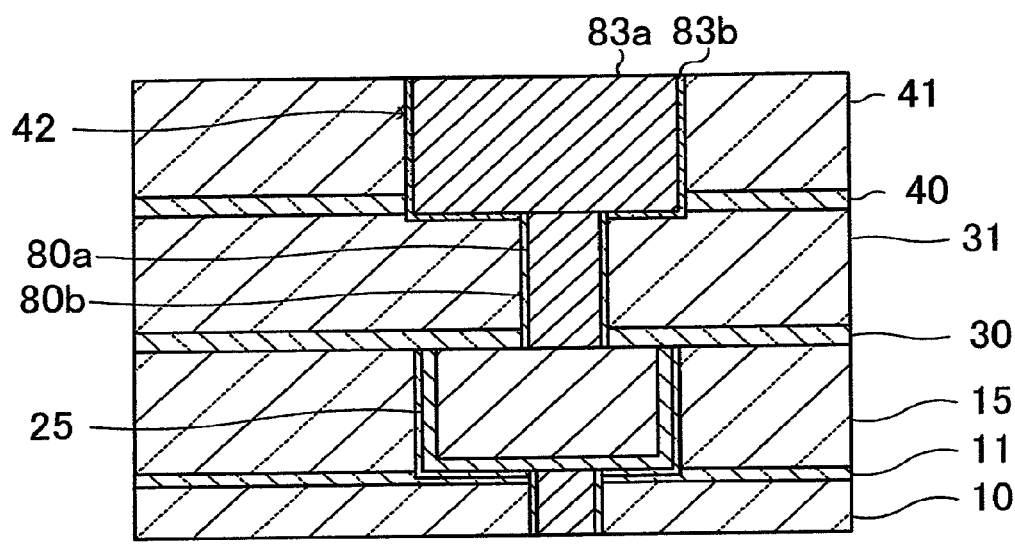

As shown in FIG. 8F, heat treatment is performed at 400° C. in a reducing atmosphere to form a wiring metal oxide film 83b at the interface between the wiring 83a and wiring layer insulating film 41, at the interface between the wiring 83a and cap film 40 and at the interface between the wiring 83a and via layer insulating film 31.

In the fifth embodiment, the via metal oxide film 80b and wiring metal oxide film 83b have the diffusion preventive function. Since the wiring 83a contains impurities, the stressmigration resistance can be increased. Since the conductive plug 80a does not contain impurities, an increase in an electric resistance can be prevented.

In the fifth embodiment, since the conductive plug 80a and wiring 83a are formed by sputtering, the kind of and concentration of impurities can be controlled highly precisely more than the case that they are formed by plating.

In the fifth embodiment, although impurities are not doped in the conductive plug 80a, desired impurities may be doped if necessary. In this case, mainly a low electric resistance is required for the conductive plug 80a and a high stressmigration resistance is required for the wiring 83a. It is therefore preferable to set the impurity concentration of the conductive plug 80a lower than that of the wiring 83a.

The present invention has been described in connection with the preferred embodiments. The invention is not limited only to the above embodiments. It will be apparent to those skilled in the art that other various modifications, improvements, combinations, and the like can be made.

What we claim are:

1. A manufacture method for a semiconductor device comprising:
    forming a first insulating film containing oxygen over a semiconductor substrate;
    forming a first recess in the first insulating film;
    forming a first barrier metal layer on an inner surface of the first recess, the first barrier metal having a thickness of 5 nm or thinner;
    forming a first copper alloy film on the first barrier metal layer;
    forming a first metal film filling all other unfilled space in the first recess, the first metal film containing copper;
    forming a first metal oxide film by heat treatment through reaction between the oxygen in the first insulating film and a metal element in the first copper alloy film;
    forming a second insulating film containing oxygen over the semiconductor substrate;
    forming a second recess in the second insulating film;
    forming a second barrier metal layer on an inner surface of the second recess, the second barrier metal layer having a thickness of 5 nm or thinner;
    forming a second copper alloy film on the second barrier metal layer;
    forming a second metal film filling all other unfilled space in the second recess, the second metal film containing copper; and
    forming a second metal oxide film by heat treatment through reaction between the oxygen in the second insulating film and a metal element in the second copper alloy film;
    wherein the first barrier metal layer and the second barrier metal layer are made of refractory metal, alloy containing a refractory metal element, or nitride of a refractory metal element, respectively, a volume of the second recess is larger than a volume of the first recess, at least one type of atoms selected from the group consisting of carbon, oxygen, nitrogen, sulfur and chlorine is contained in the first metal film and the second metal film as impurities, an impurity concentration in the first metal film is lower than an impurity concentration in the second metal film.

2. The manufacture method for a semiconductor device according to claim 1, wherein the first copper alloy film and the second copper film contain at least one element selected from a group consisting of Al, Mg, Mn, Cr, Ti, Ta, Zr, Sn, In, Zn, Ni and Co, respectively.

3. The manufacture method for a semiconductor device according to claim 1, wherein the second metal film is formed by a plating method, plating solution used for forming the second metal film contains at least one type of atoms selected from a group consisting of carbon, oxygen, nitrogen, sulfur and chlorine.

4. The manufacture method for a semiconductor device according to claim 3, wherein the plating method is performed under a condition that a total atom concentration of a carbon atom, an oxygen atom, a nitrogen atom, a sulfur atom and a chlorine atom in the second metal film becomes $1\times10^{19}$ cm$^{-3}$ or higher.

5. The manufacture method for a semiconductor device according to claim 1, wherein the second copper alloy film is formed by a plating method using plating solution that contains at least one type of atoms selected from a group consisting of carbon, oxygen, nitrogen, sulfur and chlorine, and at least one type of atoms selected from the group consisting of carbon, oxygen, nitrogen, sulfur and chlorine in the plating solution is contained in the second copper alloy film as impurities.

6. The manufacture method for a semiconductor device according to claim 5, wherein the plating method is performed under a condition that a total atom concentration of a carbon atom, an oxygen atom, a nitrogen atom, a sulfur atom and a chlorine atom in the second copper alloy film becomes $1\times10^{19}$ cm$^{-3}$ or higher.

7. The manufacture method for a semiconductor device according to claim 1, wherein the second insulating film is over the first insulating film, a conductive plug comprises the first barrier metal layer, the first copper alloy film and the first metal film in the first recess, a wiring comprises the second barrier metal layer, the second copper alloy film and the second metal film in the second recess, the conductive plug and the wiring are connected in series.

* * * * *